United States Patent
Sun et al.

(10) Patent No.: US 11,139,318 B2
(45) Date of Patent: Oct. 5, 2021

(54) ARRAY SUBSTRATE, DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Dongling Sun, Beijing (CN); Lisen Wang, Beijing (CN); Xiaobin Yin, Beijing (CN); Chaozhi Yu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 573 days.

(21) Appl. No.: 16/080,638

(22) PCT Filed: Mar. 19, 2018

(86) PCT No.: PCT/CN2018/079451
§ 371 (c)(1),
(2) Date: Aug. 28, 2018

(87) PCT Pub. No.: WO2019/007103
PCT Pub. Date: Jan. 10, 2019

(65) Prior Publication Data
US 2021/0183891 A1    Jun. 17, 2021

(30) Foreign Application Priority Data

Jul. 3, 2017 (CN) .......................... 201710536777.3

(51) Int. Cl.
*H01L 27/12* (2006.01)
*G06F 3/041* (2006.01)

(52) U.S. Cl.
CPC .......... *H01L 27/124* (2013.01); *G06F 3/0414* (2013.01); *G06F 3/04164* (2019.05); *H01L 27/1222* (2013.01)

(58) Field of Classification Search
CPC ............... G06F 3/0414; G06F 3/04164; H01L 27/1222; H01L 27/124
See application file for complete search history.

(56) References Cited

U.S. PATENT DOCUMENTS 10,503,296 B2 * 12/2019 Guo .................... G02F 1/13338
2017/0083140 A1   3/2017 Leng et al.
(Continued)

FOREIGN PATENT DOCUMENTS

CN    104142772 A    11/2014
CN    105182466 A    12/2015
(Continued)

OTHER PUBLICATIONS

China Second Office Action, Application No. 201710536777.3, dated Feb. 26, 2019, 12 pps.: with English translation.
(Continued)

*Primary Examiner* — Allan R Wilson
(74) *Attorney, Agent, or Firm* — Armstrong Teasdale LLP

(57) ABSTRACT

An embodiment of the present disclosure provides an array substrate, a display panel, and a display device, relating to the field of display technology. The array substrate includes a plurality of sub-pixel regions. The sub-pixel regions include at least one white sub-pixel region and a sub-pixel region adjacent to the white sub-pixel region. A signal line is disposed between the white sub-pixel region and the sub-pixel region adjacent thereto. At most a first data line is
(Continued)

disposed between the white sub-pixel region and the adjacent sub-pixel region. The first data line is used to provide a data signal to a sub-pixel electrode in the white sub-pixel region. The signal line transmits a signal of a different type than the data signal.

16 Claims, 5 Drawing Sheets

(56) References Cited

U.S. PATENT DOCUMENTS

2018/0335878 A1* 11/2018 Chen .................... G06F 3/04166
2018/0341354 A1* 11/2018 Guo ...................... G06F 3/0412

FOREIGN PATENT DOCUMENTS

| CN | 106406608 A | 2/2017 |
| CN | 106653770 A | 5/2017 |
| CN | 107239172 A | 10/2017 |

OTHER PUBLICATIONS

PCT International Search Report, Application No. PCT/CN2018/079451, dated May 4, 2018, 6 pages: with English translation.
PCT Written Opinion, Application No. PCT/CN2018/079451, dated May 4, 2018, 6 pages.: with English translation of relevant part.
China First Office Action, Application No. 201710536777.3, dated Aug. 3, 2018, 14 pps.: with English translation.

* cited by examiner

ARRAY SUBSTRATE, DISPLAY PANEL AND DISPLAY DEVICE

CROSS REFERENCE TO RELATED APPLICATIONS

This patent application is a National Stage Entry of PCT/CN2018/079451 filed on Mar. 19, 2018, which claims the benefit and priority of Chinese Patent Application No. 201710536777.3 filed on Jul. 3, 2017, the disclosures of which are incorporated herein by reference in their entirety as part of the present application.

BACKGROUND

The present disclosure relates to a field of display technology, and in particular, to an array substrate, a display panel, and a display device.

In the display technology, the display panel generally includes an array substrate and a package substrate that are oppositely arranged to form a cell, and the array substrate may include a plurality of sub-pixel regions. In addition, other functions such as touch control can also be incorporated into the display panel.

BRIEF DESCRIPTION

The embodiments of the present disclosure involve the following technical solutions:

A first aspect of the present disclosure provides an array substrate. The array substrate includes a plurality of sub-pixel regions including at least one white sub-pixel region and a sub-pixel region adjacent to the white sub-pixel region. A signal line is disposed between the white sub-pixel region and the sub-pixel region adjacent thereto. At most a first data line is disposed between the white sub-pixel region and the adjacent sub-pixel region. The first data line is used to provide a data signal to a sub-pixel electrode in the white sub-pixel region, and wherein the signal line transmits a signal of a different type than the data signal.

The adjacent sub-pixel region may include a first color sub-pixel region.

One signal line may be disposed between any one of the white sub-pixel regions and the first color sub-pixel region.

The signal line may be in parallel with the first data line.

The array substrate further includes a second color sub-pixel region and a third color sub-pixel region. Based on this, the white sub-pixel region, the first color sub-pixel region, the second color sub-pixel region, and the third color sub-pixel region form one pixel and are arranged along a gate line direction.

Further, the array substrate further includes a second data line, a third data line, and a fourth data line, respectively for providing a data signal to a sub-pixel electrode in the first color sub-pixel region, the second color sub-pixel region, and the third color sub-pixel region. Based on this, the first data line, the second data line, the third data line, and the fourth data line may be respectively disposed in a same side of the white sub-pixel region, the first color sub-pixel region, the second color sub-pixel region, and the third color sub-pixel region.

Further, the touch electrode lines, the first data lines, the second data lines, the third data lines, and the fourth data lines are in the same layer.

The first data line, the second data line, and the third data line may be in parallel.

The signal line may include a touch electrode line.

The array substrate may further include a touch electrode. A number of the touch electrodes is less than or equal to a number of the touch control electrode lines. One touch electrode is electrically connected to a corresponding touch electrode line.

The number of the touch electrodes may be less than the number of the touch electrode lines, and wherein the touch control electrode line which is not in contact with the touch electrode is floating.

The touch electrode may be multiplexed with a common electrode.

A second aspect of the present disclosure provides a display panel including the array substrate of the first aspect.

The display panel may further include an IC disposed on a binding area of the array substrate, wherein the IC is connected with the signal line. The IC is used to input a first driving signal to a signal line electrode through the signal line and receive a feedback signal output by the signal line electrode in the first touch stage, and input a second signal to the signal line electrode in the second stage.

In one embodiment, the first stage includes a touch stage, the signal line electrode includes a touch electrode and the first driving signal includes a touch driving signal. The second stage includes a display stage and the second signal includes a common voltage signal.

The display panel may further include a pressure detection structure.

The display panel may include a second substrate disposed opposite to the array substrate. The pressure detection structure includes a pressure detection electrode. The pressure detection electrode includes a first pressure detection electrode located on a side of the second substrate that is close to the array substrate and a second pressure detection electrode located in the array substrate.

The second pressure detection electrode may be multiplexed with the touch electrode.

A third aspect of the present application provides a display device including the display panel of the second aspect.

The display device may further include a backlight module.

A pressure detection electrode of the pressure detection structure of the display panel may be located at a side of the display panel close to the backlight module. The backlight module further includes a conductive layer on a side thereof away from the display panel.

The backlight module may be configured to emit light of progressive brightness. In a direction along a side of the display panel where the binding area is located to a side opposite to the side, the brightness of the light emitted by the backlight module gradually increases.

BRIEF DESCRIPTION OF THE DRAWINGS

In order to more clearly describe the embodiments of the present disclosure or the technical solutions in the prior art, the drawings used in the description of the embodiments or the prior art will be briefly described below. Obviously, the drawings in the following description are merely some embodiments of the present disclosure. Those skilled in the art can obtain other drawings based on these drawings without any creative work.

DETAILED DESCRIPTION

Figure 1:
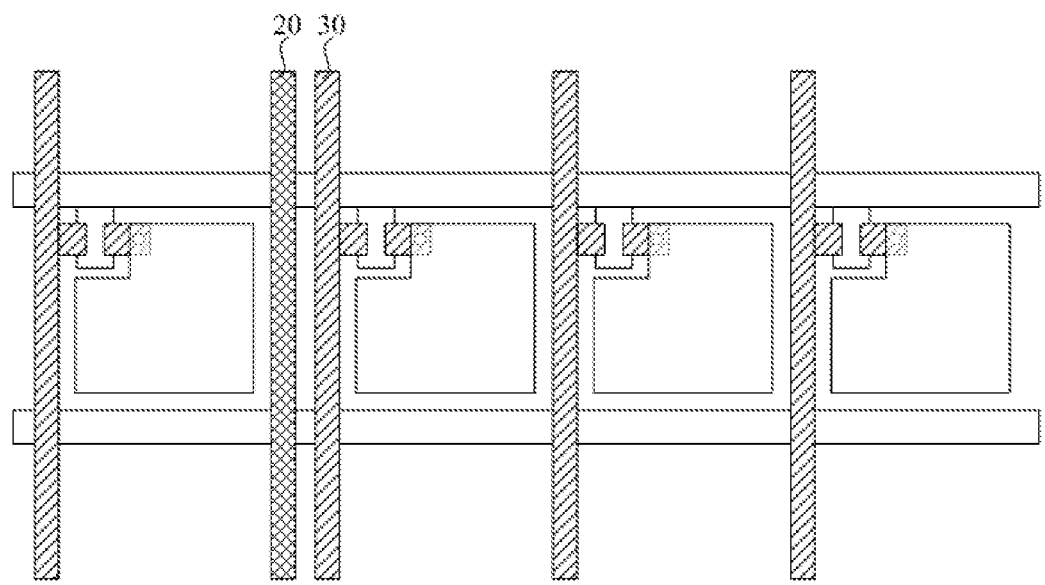
FIG. 1 is a schematic top view of an array substrate.

The technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

When introducing elements and the embodiments of the present disclosure, the articles "a," "an," "the," and "said" are intended to mean that there are one or more of the elements. The terms "comprising," "including," "containing," and "having" are intended to be inclusive and mean that there may be additional elements other than the listed elements.

For purposes of the description hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

With the rapid development of display technologies, various functions such as touch control, 3D-Touch, and the like are integrated into the display device. However, this integration introduces additional signal lines, such as touch electrode lines, pressure sensing lines for 3D-Touch, and the like, which may have a potentially adverse effect on the display.

To implement these additional functions, these additional signal lines need to be set. For example, to realize the touch sensing function, a touch electrode line electrically connected with the touch electrode is set to input a touch signal to the touch electrode through the touch electrode line, or receive a feedback signal fed back by the touch electrode. As shown in FIG. 1, in a solution, the signal line 20 and the data line 30 are disposed close to the array substrate. However, this will cause the data signal on the data line 30 to be pulled or disturbed by the signal of its neighboring signal line 20. The pulling or interfering to the data signal on the data line 30, from an end of the data line 30 close to the integrated circuit (IC to an end far away from the IC, shows an increasing trend. As a result, there is a gradual change in the display color of the product. For example, uneven display, such as blue or purple, appears in the end far away from the IC.

Figure 2A:
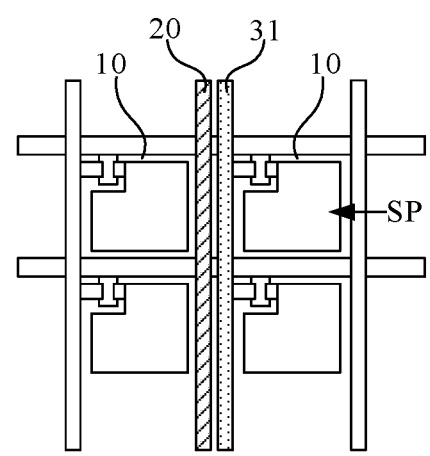
FIG. 2A is a schematic top view of an array substrate of an embodiment of the present disclosure.
Figure 2B:
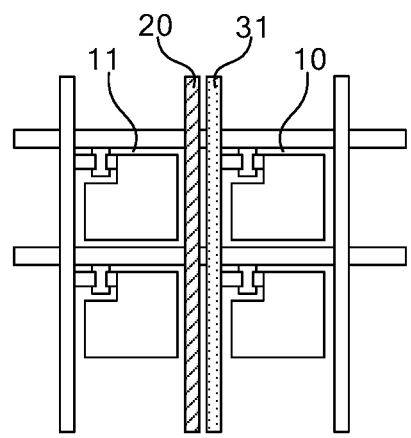
FIG. 2B is a schematic top view of an array substrate of an embodiment of the present disclosure.

An embodiment of the present disclosure provides an array substrate, as shown in FIGS. 2A and 2B, including a plurality of sub-pixel regions SP, wherein the plurality of sub-pixel regions include at least one white sub-pixel region 10. In one embodiment, as shown in FIG. 2A, two white sub-pixel regions may be adjacently disposed, that is, the adjacent sub-pixel region of the white sub-pixel region 10 is another white sub-pixel region 10. In one embodiment, as shown in FIG. 2B, the sub-pixel region adjacent to the white sub-pixel region 10 is a first color sub-pixel region 11. A signal line 20 is disposed between the white sub-pixel region 10 and the adjacent sub-pixel region (another white sub-pixel region 10 or the first color sub-pixel region 11). At most a first data line 31 is disposed between the white sub-pixel region 10 and the adjacent sub-pixel region 11. The first data line 31 is used to provide data signals to the sub-pixel electrodes in the white sub-pixel region 10, wherein the signal lines transmit different types of signals from the data signals.

It should be noted that, first, those skilled in the art should understand that when the array substrate is applied to a display device, the white sub-pixel region 10 is used to emit white light. In that case, only from the structure of the array substrate 10, the structure of the white sub-pixel region 10 is the same as that of the adjacent sub-pixel region 11 such as the first color sub-pixel region. In order to clearly describe the present disclosure, the region where a sub-pixel for emitting white light is located is referred to as a white sub-pixel region 10, and the region where a sub-pixel for emitting a certain color light is located is referred to as a color sub-pixel region, for example, the first color sub-pixel region 11.

Figure 3:
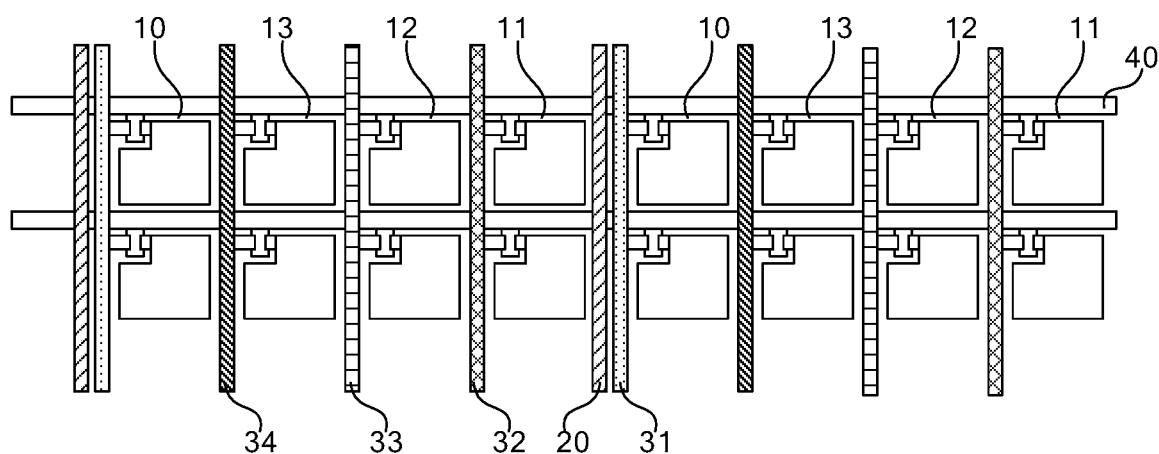
FIG. 3 is a schematic top view of an array substrate of an embodiment of the present disclosure.
Figure 4:
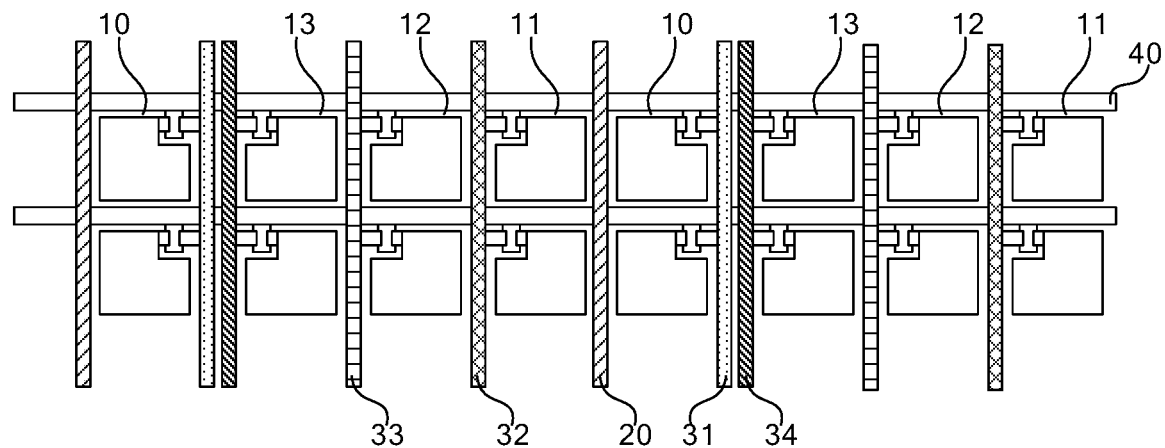
FIG. 4 is a schematic top view of an array substrate of an embodiment of the present disclosure.

Second, when the array substrate is applied to a display device, the display device realizes display based on three primary colors of light. Therefore, when the adjacent sub-pixel region is the first color sub-pixel region 11, the first color sub-pixel region 11 is used to emit one of the three primary colors. On this basis, as shown in FIG. 3 and FIG. 4, the array substrate should further include a second color sub-pixel region 12 and a third color sub-pixel region 13. The first color sub-pixel region 11, the second color sub-pixel region 12, and the third color sub-pixel region 13 is used to emit one of the three primary color lights, respectively. The three primary colors of light may be red, green, blue light, and/or be cyan, magenta, and yellow light.

Third, as shown in FIG. 3 and FIG. 4, to provide data signals to each sub-pixel, in addition to the first data line 31, the array substrate also include a second data line 32, a third data line 33, and a fourth data line 34. The second data line 32 is used to provide data signals to the sub-pixel electrodes of the adjacent sub-pixel region 11. The third data line 33 is used to provide data signals to the sub-pixel electrodes of the second color sub-pixel region 12. The fourth data line 34 is used to supply data signals to the sub-pixel electrodes of the third color sub-pixel region 13.

Fourth, at most a first data line 31 is disposed between the white sub-pixel region 10 and an adjacent sub-pixel region (for example, another white sub-pixel region 10 or the first color sub-pixel region 11). That is, only the signal line 20 is disposed between the white sub-pixel region 10 and the adjacent sub-pixel region, or, the signal line 20 and the first data line 31 are disposed between the white sub-pixel region 10 and the adjacent sub-pixel region.

An embodiment of the present disclosure provides an array substrate by arranging the signal line 20 between the white sub-pixel region 10 and an adjacent sub-pixel region (for example, the first color sub-pixel region 11 or another white sub-pixel region). At most a first data line 31 for providing a data signal to the sub-pixel electrodes in the white sub-pixel region 10 is also provided between the white sub-pixel region 10 and the adjacent sub-pixel region so that the signal line 20 is not close to the data line for providing a data signal to the sub-pixel electrode of the color sub-pixel region. Thus, the signals on the signal lines 20 do not affect the data lines supplying the data signals to the sub-pixel electrodes of the color sub-pixel region. In the case where the first data line 31 is further provided between the white sub-pixel region 10 and the adjacent sub-pixel region 11, although the signal on the signal line 20 has an influence on the data signal on the first data line 31, the white sub-pixel region 10 which is used to emit white light does not change its color. Therefore, it is possible to avoid the problem of display unevenness due to the signal on the signal line 20. In addition, by providing the white sub-pixel region 10 on the array substrate, the contrast of the display device including the array substrate can be increased and power consumption can be reduced.

Hereinafter, an example in which the adjacent sub-pixel region is the first color sub-pixel region 11 and the signal line 20 is the touch electrode line will be described.

When the array substrate is applied to the display device, to improve the display uniformity of the display device, as shown in FIG. 2B and FIG. 3, a touch electrode line 20 may be disposed between any white sub-pixel region 10 and the first color sub-pixel region 11.

In order to increase the aperture ratio, only one touch electrode line 20 is disposed between a row of white sub-pixel regions 10 and a row of the first color sub-pixel regions 11 along the direction of the first data line 31.

In actual use, each touch electrode line 20 does not necessarily serve as a touch function, i.e., each touch electrode line 20 is not necessarily connected to the IC, and can be set according to actual needs. The touch electrode lines 20 that are not connected to the IC are merely used to improve display uniformity and are not used as a touch function.

One touch electrode line 20 is disposed beside each data line in the prior art to solve the problem of display unevenness due to the signal on the touch electrode line 20. In the embodiment of the present disclosure, one touch electrode line 20 is disposed only between the white sub-pixel region 10 and the first color sub-pixel region 11, thus the number of the touch electrode lines 20 can be greatly reduced, thereby increasing the aperture ratio. Based on this, even if each touch electrode wire 20 is connected to the IC, since the number of the touch electrode wires 20 is less, the performance requirement for the IC can be reduced, and thus the cost can be reduced.

Figure 5:
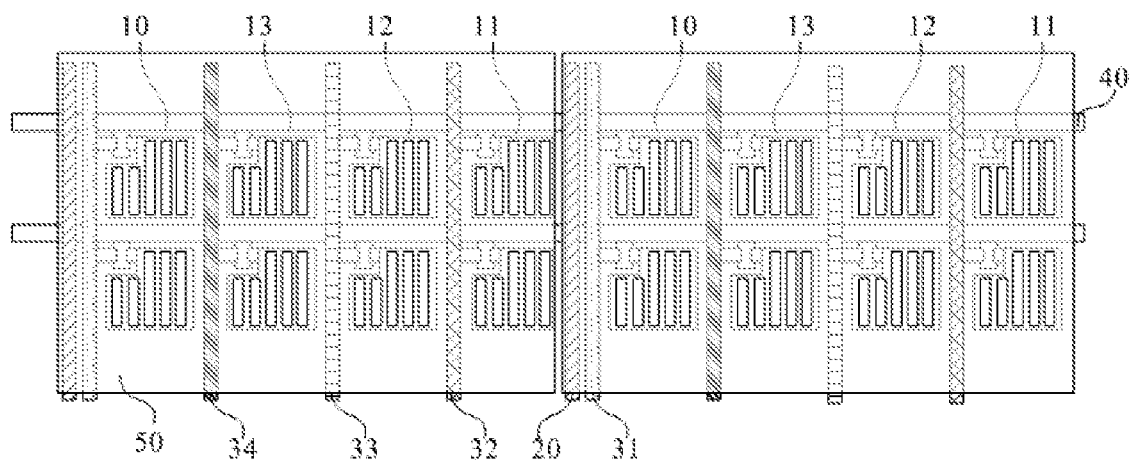
FIG. 5 is a schematic top view of an array substrate of an embodiment of the present disclosure.

Further, as shown in FIG. 5, the array substrate further includes a touch control electrode 50. The number of touch control electrodes 50 is less than or equal to the number of the touch control electrode lines 20. Wherein one touch control electrode 50 and a corresponding one touch control electrode lines 20 are electrically connected. The touch electrodes 50 are multiplexed with the common electrodes.

Of course, those skilled in the art should understand that each sub-pixel region further includes a thin film transistor.

The thin film transistor includes a gate, a gate insulating layer, an active layer, a source, and a drain. The drain is electrically connected to the pixel electrode. The source is electrically connected to the data line corresponding to the sub-pixel. The gate is electrically connected to the gate line 40.

When the number of the touch electrodes 50 is equal to the number of the touch electrode lines 20, the touch electrodes 50 and the touch electrode lines 20 are in one-to-one correspondence and electrically connected. When the number of the touch electrodes 50 is smaller than the number of the touch electrodes 20, one touch electrode 50 is electrically connected to one touch electrode line 20, and the remaining touch electrode lines 20 are suspended without in electrical connection with any electrodes or components.

The touch electrodes may include touch drive electrodes and touch sense electrodes in a mutual-capacity manner.

According to an embodiment of the present disclosure, the touch electrode 50 can be multiplexed with the common electrode. Specifically, in the display stage, the common voltage is provided to the touch electrode 50 making the touch electrode 50 serving as a common electrode. In the touch stage, a touch driving signal is provided to the touch electrode 50, that is, the touch electrode 50 serves as a touch driving electrode. When the array substrate is applied to a display device, a touch function is realized based on a self-capacitance method.

The touch electrode 50 may have a rectangular shape.

On the one hand, the touch electrode 50 is multiplexed with the common electrode, which can make the array substrate have higher integration and thinner thickness, and does not increase the patterning process. On the other hand, Touch and Display Driver Integration (TDDI) technology can be used for display and touch, reducing the number of ICs. In another aspect, when the touch electrode 50 is used as a common electrode, the liquid crystal can be driven to deflect based on Advanced Super Dimensional Switching (ADS) technology, so that the display device to which the array substrate is applied has high resolution, high transmittance, low power consumption, wide viewing angle, high aperture ratio, low color difference, no squeeze water ripple, and other advantages.

The touch electrode lines 20 may be arranged in parallel with the first data lines 31.

In this way, when the touch electrode lines 20 and the first data lines 31 are both disposed between the white sub-pixel region 10 and the first color sub-pixel region 11 and are disposed in the same layer, the risk of short circuit of the touch electrode line 20 and the first data line 31 can be reduced and the aperture ratio can be increased.

Further, the first data line 31, the second data line 32, the third data line 33, and the fourth data line 34 are also disposed in parallel. This simplifies the process of preparing the data lines.

As shown in FIGS. 3-5, the white sub-pixel region 10, the first color sub-pixel region 11, the second color sub-pixel region 12, and the third color sub-pixel region 13 may form one pixel and may be arranged along the direction of the gate line 40.

That is, each pixel includes one white sub-pixel region 10, one first color sub-pixel region 11, one second color sub-pixel region 12, and one third color sub-pixel region 13. The white sub-pixel region 10, the first color sub-pixel region 11, the second color sub-pixel region 12, and the third color sub-pixel region 13 in one pixel are arranged along the gate line direction.

Figure 8A:
FIG. 8A is a schematic view of a pixel array of an embodiment of the present disclosure.
Figure 8A:
Figure 8B:
FIG. 8B is a schematic view of a pixel array of an embodiment of the present disclosure.
Figure 8B:
Figure 8C:
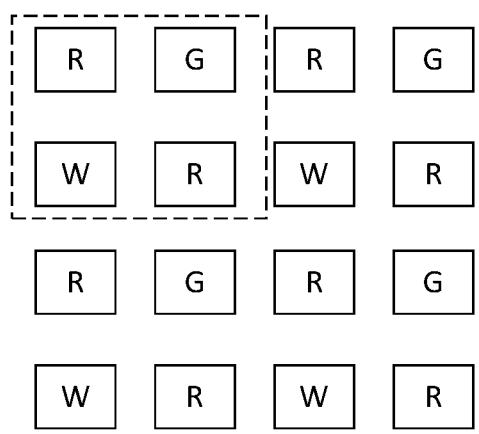
FIG. 8C is a schematic view of a pixel array of an embodiment of the present disclosure.

Each pixel may be a matrix of N rows and M columns of sub-pixels, wherein N≥1 and M≥1. In one embodiment, as shown in FIG. 8A, N=1 and M=4, the sub-pixels in the column direction of the pixel array have the same color. In one embodiment, as shown in FIG. 8B, N=1 and M=4, the colors of adjacent sub-pixels in the column direction of the pixel array are different. In one embodiment, as shown in FIG. 8C, N=2 and M=2, and each pixel can be a 2-pixel and 2-column sub-pixel matrix. The numerical values of N and M are not limited to those shown in FIGS. 8A-8C, but can also be set according to actual needs. It should be noted that the color of the sub-pixel herein refers to the color that can be displayed when the sub-pixel operates, and does not refer to the color of the material of the sub-pixel itself.

In this way, the touch electrode line 20 and the first data line 31 can be formed at most between the white sub-pixel region 10 and the first color sub-pixel region 11 in a relatively simple process. Moreover, such sub-pixel arrangement brings a better display effect.

Further, as shown in FIG. 3 and FIG. 5, the first data line 31, the second data line 32, the third data line 33, and the fourth data line 34 are respectively disposed on the same side of the white sub-pixel region 10, the first color sub-pixel region 11, the second color sub-pixel region 12, and the third color sub-pixel region 13, respectively.

Wherein, each data line can be set on the left side of the corresponding color sub-pixel region or on the right side.

By setting each data line on the same side of the corresponding color sub-pixel region, all data lines can be uniformly distributed and display uniformity can be further improved.

Further, the touch electrode lines 20, the first data lines 31, the second data lines 32, the third data lines 33, and the fourth data lines 34 are disposed in the same layer.

That is, the touch electrode lines 20, the first data lines 31, the second data lines 32, the third data lines 33, and the fourth data lines 34 are formed by the one patterning process. In this way, the number of patterning processes can be reduced.

An embodiment of the present disclosure further provides a display panel including the above array substrate and an opposite substrate.

Wherein, the color film and the black matrix may be disposed on the array substrate, and may also be disposed on the opposite substrate. The color filter includes a white photoresist pattern disposed in the white sub-pixel region 10, a first color photoresist pattern disposed in the first color sub-pixel region 11, a second color photoresist pattern disposed in the second color sub-pixel region 12, and a third color photoresist pattern disposed in the third color sub-pixel region 13. The first color, the second color, and the third color are three primary colors.

The display panel according to the embodiments of the present disclosure has the same technical effects as the array substrate, which will not be described herein.

The display panel may further include an IC disposed on a binding area on the array substrate, and the IC is connected with the signal line 20. The IC is used, in a first touch stage, to input a first driving signal to the signal line electrode through a signal line and receive the feedback signal output by the signal line electrode, in the second stage, input the second signal to the signal line electrode.

In an embodiment, wherein the first stage includes a touch stage, the signal line electrode includes a touch control electrode, and the first driving signal includes a touch driving signal. The second stage includes a display stage and the second signal includes a common voltage signal. That is, in this embodiment, the IC is connected to the touch electrode line 20. The IC is used to, in the touch phase, input the touch drive signal to the touch electrode 50 through the touch electrode line 20 and receive the feedback signal output by touch electrode 50, in the display stage, input a common voltage signal to the touch electrode 50.

On the one hand, the touch electrodes 50 is multiplexed with the common electrode, making the array substrate have a higher degree of integration and a thinner thickness without an increase in the patterning process. On the other hand, one IC can be used for display and touch and costs can be reduced.

The display panel may further include a pressure detection structure.

Figure 7A:
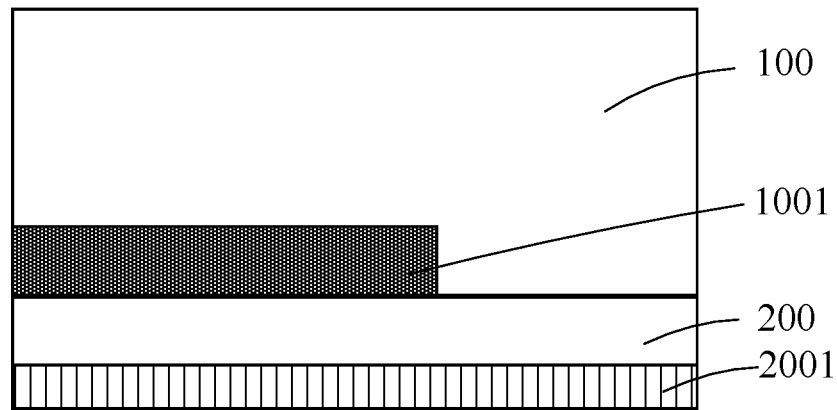
FIG. 7A is a schematic view of a display device of an embodiment of the present disclosure.

Wherein, the pressure detection structure may include a plurality of pressure detection electrodes, and the pressure detection electrodes are disposed on the array substrate. As shown in FIG. 7A, in order to avoid affecting the display and the touch function, the pressure detection electrode 1001 may be disposed on a side of the display panel 100 close to the backlight module 200. Based on this, the pressure value may be calculated based on a change in the distance between the pressure detection electrode 1001 and the backlight module 200 located on a side thereof away from the display panel (e.g., metal back plate) 2001 when subjected to pressure.

Figure 7B:
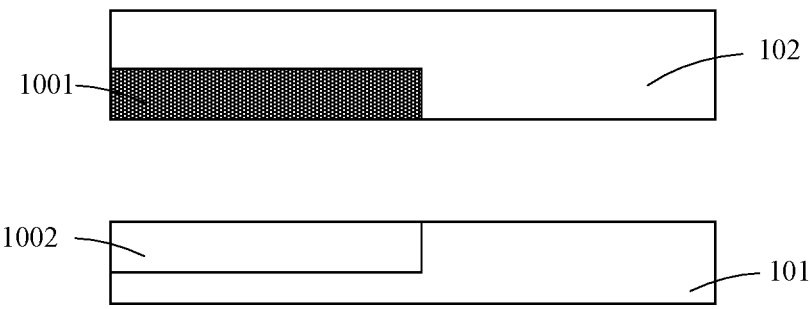
FIG. 7B is a schematic view of a display panel of an embodiment of the present disclosure.

Alternatively, as shown in FIG. 7B, the pressure detection structure includes a plurality of first pressure detection electrodes 1001 and second pressure detection electrodes 1002. The first pressure detection electrode 1001 is disposed on a side of the opposite substrate 102, aligned with the array substrate 101 to form a cell, facing towards the array substrate 101. The second pressure detection electrode may be multiplexed with the touch electrode 50, so that the pressure value is performed based on a change in the distance between the first pressure detection electrode 1001 and the second pressure detection electrode 1002 when the pressure is applied.

The embodiments of the present disclosure provide a pressure detection structure to realize the pressure detection function and improve the user experience.

An embodiment of the present disclosure further provides a display device including the above display panel and a backlight module.

The display device may be any product having a display function such as a display, a mobile phone, a tablet computer, a notebook computer, a television, a digital photo frame, a navigator, and the like.

Considering that the data line has a resistance, the signal on each data line is gradually weakened from the terminal connected to the IC terminal to the terminal far away from the IC terminal. To compensate for the difference in the actual brightness displayed by the display device to further achieve even display, optionally, the backlight module is configured to emit light of progressive brightness. Wherein the brightness of the light emitted by the backlight module gradually increases along the direction from a side of the display panel where the binding area is located to the opposite side.

Figure 6:
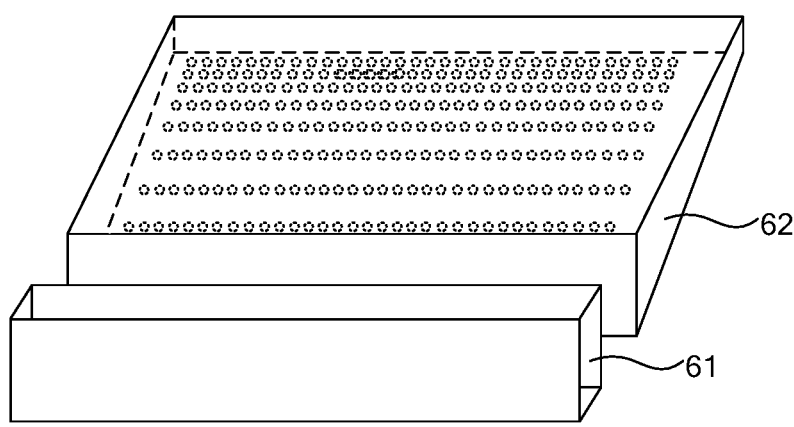
FIG. 6 is a schematic diagram of a backlight module of an embodiment of the present disclosure.

As shown in FIG. 6, the backlight module may include a light source 61, a light guide plate 62, and the like.

The light source 61 can be disposed near the binding area of the display panel, the dot on the light guide plate 62 gradually increases in density in a direction from a side of the light guide plate 62 disposed with light source 61 to the opposite side. The denser the dot, the stronger the brightness of the light emitted by the light guide plate 62. The thinner the dot, the weaker the brightness of the light emitted by the light guide plate 62.

The foregoing descriptions are merely specific implementation manners of the present disclosure, but the scope of protection of the present disclosure is not limited thereto. Any person skilled in the art may easily conceive of changes within the technical scope disclosed in the present disclosure. Alternatives should all be covered by the scope of this disclosure. Therefore, the protection scope of the present disclosure should be based on the protection scope of the claims.

What is claimed is:

1. A display panel comprising:
   an array substrate, the array substrate comprising a plurality of sub-pixel regions, the plurality of sub-pixel regions comprising at least one white sub-pixel region, wherein a signal line is disposed between the at least one white sub-pixel region and a sub-pixel region adjacent thereto, and wherein at most a first data line is disposed between the white sub-pixel region and the adjacent sub-pixel region, wherein the first data line is used to provide a data signal to a sub-pixel electrode in the white sub-pixel region, and wherein the signal line transmits a signal of a different type than the data signal;
   an IC disposed on a binding area of the array substrate, wherein the IC is connected with the signal line, and wherein the IC is used to input a first driving signal to a signal line electrode through the signal line and receive a feedback signal output by the signal line electrode in the first touch stage, and input a second signal to the signal line electrode in the second stage, wherein the first stage comprises a touch stage, wherein the signal line electrode comprises a touch electrode, wherein the first driving signal comprises a touch driving signal, wherein the second stage comprises a display stage, and wherein the second signal comprises a common voltage signal; and
   a pressure detection structure.

2. The display panel according to claim 1, wherein the adjacent sub-pixel region includes a first color sub-pixel region.

3. The display panel according to claim 2, wherein one signal line is disposed between any one of the white sub-pixel regions and the first color sub-pixel region.

4. The display panel according to claim 1, wherein the signal line is in parallel with the first data line.

5. The display panel according to claim 2, further comprising a second color sub-pixel region and a third color sub-pixel region, wherein the white sub-pixel region, the first color sub-pixel region, the second color sub-pixel region, and the third color sub-pixel region form one pixel and are arranged along a gate line direction.

6. The display panel according to claim 5, further comprising a second data line, a third data line, and a fourth data line, respectively for providing a data signal to a sub-pixel electrode in the first color sub-pixel region, the second color sub-pixel region, and the third color sub-pixel region; and
   wherein the first data line, the second data line, the third data line, and the fourth data line are respectively disposed in a same side of the white sub-pixel region, the first color sub-pixel region, the second color sub-pixel region, and the third color sub-pixel region.

7. The display panel according to claim 6, wherein the signal line, the first data line, the second data line, the third data line, and the fourth data line are in the same layer.

8. The display panel according to claim 7, wherein the first data line, the second data line, the third data line, and the fourth data line are in parallel.

9. The display panel according to claim 1, wherein the signal line includes a touch electrode line.

10. The display panel according to claim 1, wherein the signal line includes touch control electrode lines, and the display panel further comprises a touch electrode, wherein a number of the touch electrodes is less than or equal to a number of the touch control electrode lines, and wherein one touch electrode is electrically connected to a corresponding touch electrode line.

11. The display panel according to claim 10, wherein the number of the touch electrodes is less than the number of the touch electrode lines, wherein the touch control electrode line which is not in contact with the touch electrode is floating, and wherein the touch electrode is multiplexed with a common electrode.

12. The display panel according to claim 1, wherein the display panel comprises a second substrate disposed opposite to the array substrate, wherein the pressure detection structure comprises a pressure detection electrode, and wherein the pressure detection electrode comprises a first pressure detection electrode located on a side of the second substrate that is close to the array substrate and a second pressure detection electrode located in the array substrate.

13. The display panel according to claim 12, wherein the second pressure detection electrode is multiplexed with the touch electrode.

14. A display device comprising the display panel according to claim 1.

15. The display device according to claim 14, further comprising a backlight module, wherein a pressure detection electrode of the pressure detection structure of the display panel is located at a side of the display panel close to the backlight module, and wherein the backlight module further comprises a conductive layer on a side thereof away from the display panel.

16. The display device according to claim 14, further comprising a backlight module, wherein the backlight module is configured to emit light of progressive brightness, and wherein, in a direction along a side of the display panel where the binding area is located to a side opposite to the side, the brightness of the light emitted by the backlight module gradually increases.

* * * * *